United States Patent
Im et al.

(10) Patent No.: US 11,251,653 B2
(45) Date of Patent: Feb. 15, 2022

(54) SYSTEM AND METHOD OF MEASURING MAXIMUM POWER POINT TRACKING EFFICIENCY

(71) Applicant: ELECTRONICS AND TELECOMMUNICATIONS RESEARCH INSTITUTE, Daejeon (KR)

(72) Inventors: Jong Pil Im, Daejeon (KR); Seungeon Moon, Daejeon (KR); Jeong Hun Kim, Daejeon (KR); Jiyong Woo, Daejeon (KR); Yeriaron Kim, Daejeon (KR); Solyee Im, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 30 days.

(21) Appl. No.: 17/023,824

(22) Filed: Sep. 17, 2020

(65) Prior Publication Data

US 2021/0119483 A1     Apr. 22, 2021

(30) Foreign Application Priority Data

Oct. 16, 2019  (KR) .................. 10-2019-0128471
Jan. 7, 2020   (KR) .................. 10-2020-0001999

(51) Int. Cl.
  *H02J 3/14*     (2006.01)
  *H02J 50/00*    (2016.01)
  (Continued)

(52) U.S. Cl.
  CPC ............ *H02J 50/001* (2020.01); *G01R 21/00* (2013.01); *H02M 3/158* (2013.01)

(58) Field of Classification Search
  CPC . G05F 1/67; H01L 35/34; H02S 50/00; Y02E 10/58; Y02E 10/56; Y02E 10/50
  (Continued)

(56) References Cited

U.S. PATENT DOCUMENTS

2015/0112495 A1   4/2015   Kim et al.
2017/0222441 A1   8/2017   Chen et al.
2019/0312438 A1  10/2019   Chu

FOREIGN PATENT DOCUMENTS

JP   5968758 B2    8/2016
JP   6479425 B2    3/2019
KR   100217064 B1  9/1999

OTHER PUBLICATIONS

Nianchun Wang et al., "Optimization of Photovoltaic MPPT System Efficiency Based on Combined Algorithm", 2018 21st International Conference on Electrical Machines and Systems (ICEMS), Oct. 7-10, 2018.

(Continued)

*Primary Examiner* — Quan Tra
*Assistant Examiner* — Anh-Quan Tra
(74) *Attorney, Agent, or Firm* — Rabin & Berdo, P.C.

(57) ABSTRACT

Disclosed is a system for tracking a maximum power point. The system includes an energy harvesting device, a power management integrated circuit including a switching circuit that adjusts an input voltage that is transmitted from the energy harvesting device and a conversion circuit that converts the input voltage adjusted by the switching circuit to output an output voltage, and a measuring device that calculates a ratio of a second power based on the input voltage to a first power based on an open circuit voltage of the energy harvesting device, using an internal impedance of the energy harvesting device and an input impedance of the power management integrated circuit.

15 Claims, 8 Drawing Sheets

(51) Int. Cl.
*G01R 21/00* (2006.01)
*H02M 3/158* (2006.01)

(58) Field of Classification Search
USPC .......................................................... 307/31
See application file for complete search history.

(56) References Cited

OTHER PUBLICATIONS

Sungkyu Cho et al., "A Coreless Maximum Power Point Tracking Circuit of Thermoelectric Generators for Battery Charging Systems", IEEE Asian Solid-State Circuits Conference, Nov. 8-10, 2010.

SYSTEM AND METHOD OF MEASURING MAXIMUM POWER POINT TRACKING EFFICIENCY

CROSS-REFERENCE TO RELATED APPLICATIONS

This application claims priority under 35 U.S.C. § 119 to Korean Patent Application Nos. 10-2019-0128471 filed on Oct. 16, 2019, and 10-2020-0001999 filed on Jan. 7, 2020, respectively, in the Korean Intellectual Property Office, the disclosures of which are incorporated by reference herein in their entireties.

BACKGROUND

Embodiments of the inventive concept described herein relate to a measuring device for tracking a maximum power point, a system for tracking the maximum power point, and a method of tracking the maximum power point by using the measuring device.

As an energy harvesting device that harvests energy wasted in a surrounding environment, there are a thermoelectric energy harvesting device (thermoelectric generator), a piezoelectric energy harvesting device (piezoelectric generator), an RF energy harvesting device (radio frequency generator), a photoelectric energy harvesting device (photovoltaic generator), etc. For example, the thermoelectric energy harvesting device generates electromotive force by using electrons that move from a high temperature to a low temperature when a uniform temperature difference occurs between an upper part and a lower part of the thermoelectric energy harvesting device.

Electrical energy generated by the energy harvesting device is transferred to a power management integrated circuit (PMIC). The power management integrated circuit may convert the electrical energy and may supply the converted electrical energy to a battery or a load.

A maximum power point tracking (MPPT) technology is a technology for satisfying a condition of transferring a maximum power from the energy harvesting device to the load. To determine a loss between the electromotive force generated by the energy harvesting device and a power transferred from the energy harvesting device to the power management integrated circuit, a method for measuring an efficiency of the maximum power point tracking technology is needed.

SUMMARY

Embodiments of the inventive concept provide a measuring device for tracking a maximum power point by using an internal impedance of an energy harvesting device and an input impedance of a power management integrated circuit, a system for tracking the maximum power point, and a method of tracking the maximum power point by using the measuring device.

According to an exemplary embodiment of the inventive concept, a system for tracking a maximum power point includes an energy harvesting device, a power management integrated circuit including a switching circuit that adjusts an input voltage that is transmitted from the energy harvesting device and a conversion circuit that converts the input voltage adjusted by the switching circuit to output an output voltage, and a measuring device that calculates a ratio of a second power based on the input voltage to a first power based on an open circuit voltage of the energy harvesting device, using an internal impedance of the energy harvesting device and an input impedance of the power management integrated circuit.

According to an exemplary embodiment of the inventive concept, a method of tracking a maximum power point of an energy harvesting device connected to a power management integrated circuit, using a measuring device including a processor and an interface circuit, includes receiving, by the interface circuit, an internal impedance of an energy harvesting device and an input impedance of the power management integrated circuit, calculating, by the processor, a ratio of a second power based on the input voltage to a first power based on an open circuit voltage of the energy harvesting device, using the internal impedance of the energy harvesting device and the input impedance of the power management integrated circuit; and outputting the calculated ratio by the interface circuit.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
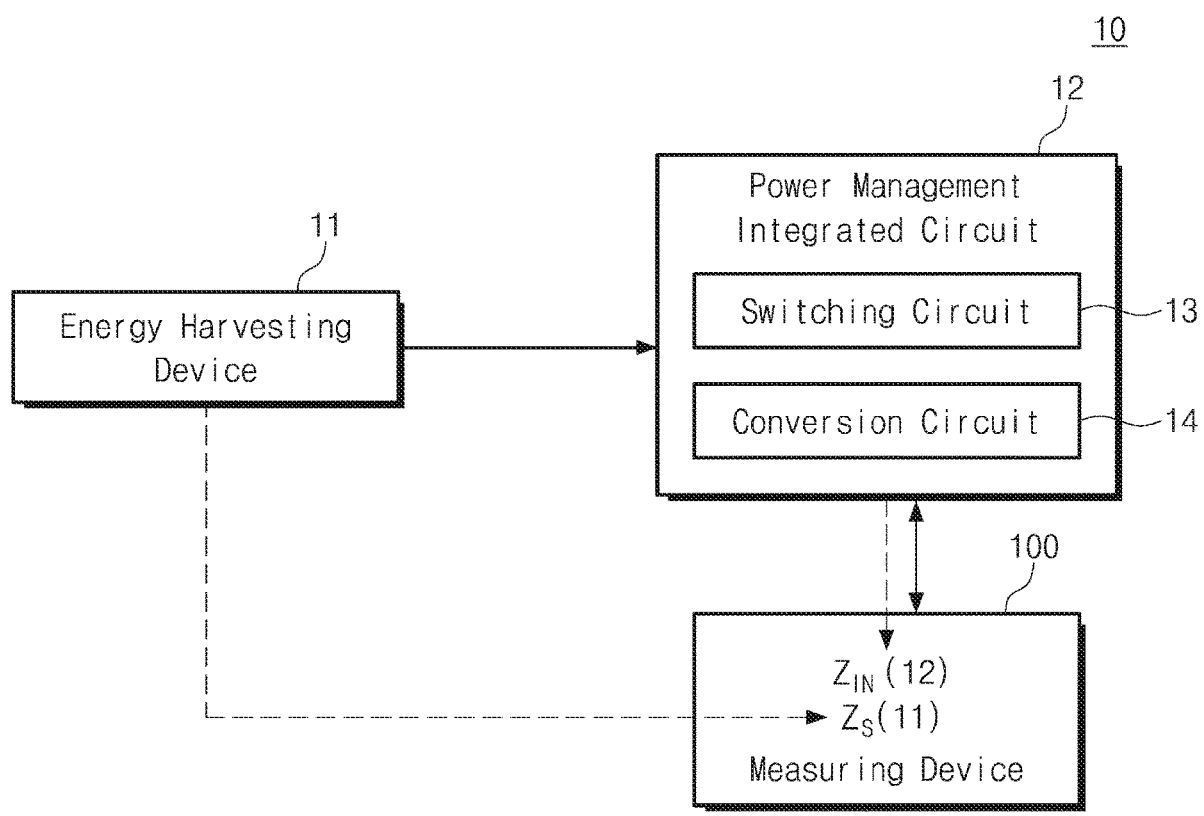
FIG. 1 is a block diagram illustrating a system for tracking a maximum power point according to an embodiment of the inventive concept.

Hereinafter, embodiments of the inventive concept will be described clearly and in detail such that those skilled in the art may easily carry out the inventive concept.

Hereinafter, with reference to the accompanying drawings, a preferred embodiment of the inventive concept will be described in more detail. To facilitate the overall understanding in describing the inventive concept, the similar reference numerals will be used for the similar components in the drawings, and additional descriptions for the similar components will be omitted to avoid redundancy.

FIG. 1 is a block diagram illustrating a system for tracking a maximum power point according to an embodiment of the inventive concept. Referring to FIG. 1, a system 10 for tracking a maximum power point may include an energy harvesting device 11, a power management integrated circuit 12, and a measuring device 100.

The energy harvesting device 11 may output electrical energy by harvesting energy wasted in a surrounding environment. For example, the energy harvesting device 11 may transmit power based on the electrical energy to the power management integrated circuit 12 as a voltage or a current. The energy harvesting device 11 may transmit power to the power management integrated circuit 12 instead of a uniform power source such as a battery. The energy harvesting device 11 may harvest energy from energy sources such as heat, sunlight, and vibration in the surrounding environment, and may convert the harvested energy into electrical energy to transmit power to the power management integrated circuit 12. In one embodiment, the energy harvesting device 11 may be one of a thermoelectric energy harvesting device, a piezoelectric energy harvesting device, a radio frequency (RF) energy harvesting device, and a photoelectric energy harvesting device, but is not limited thereto.

The power management integrated circuit (PMIC) 12 may adjust the level of the voltage and current received from the energy harvesting device 11, and may transmit the adjusted voltage and current to an external device. For example, the external device may be the battery or a load, but is not limited thereto.

The power management integrated circuit 12 may include a switching circuit 13 and a conversion circuit 14.

The switching circuit 13 may adjust an input voltage transmitted from the energy harvesting device 11. The conversion circuit 14 may convert the input voltage adjusted by the switching circuit 13, and may output the converted voltage to the external device as an output voltage.

The measuring device 100 may calculate a ratio of a power based on the input voltage of the power management integrated circuit 12 and a power based on an open circuit voltage of the energy harvesting device 11, using an internal impedance $Z_S$ of the energy harvesting device 11 and an input impedance $Z_{IN}$ of the power management integrated circuit 12. For example, the measuring device 100 may calculate the ratio of the power based on the input voltage of the power management integrated circuit 12 to the power based on the open circuit voltage of the energy harvesting device 11. In one embodiment, the power based on the input voltage of the power management integrated circuit 12 may be determined based on the internal impedance $Z_S$ of the energy harvesting device 11 and the input voltage of the power management integrated circuit 12. The detail operation of the measuring device 100 will be described later.

Figure 2:
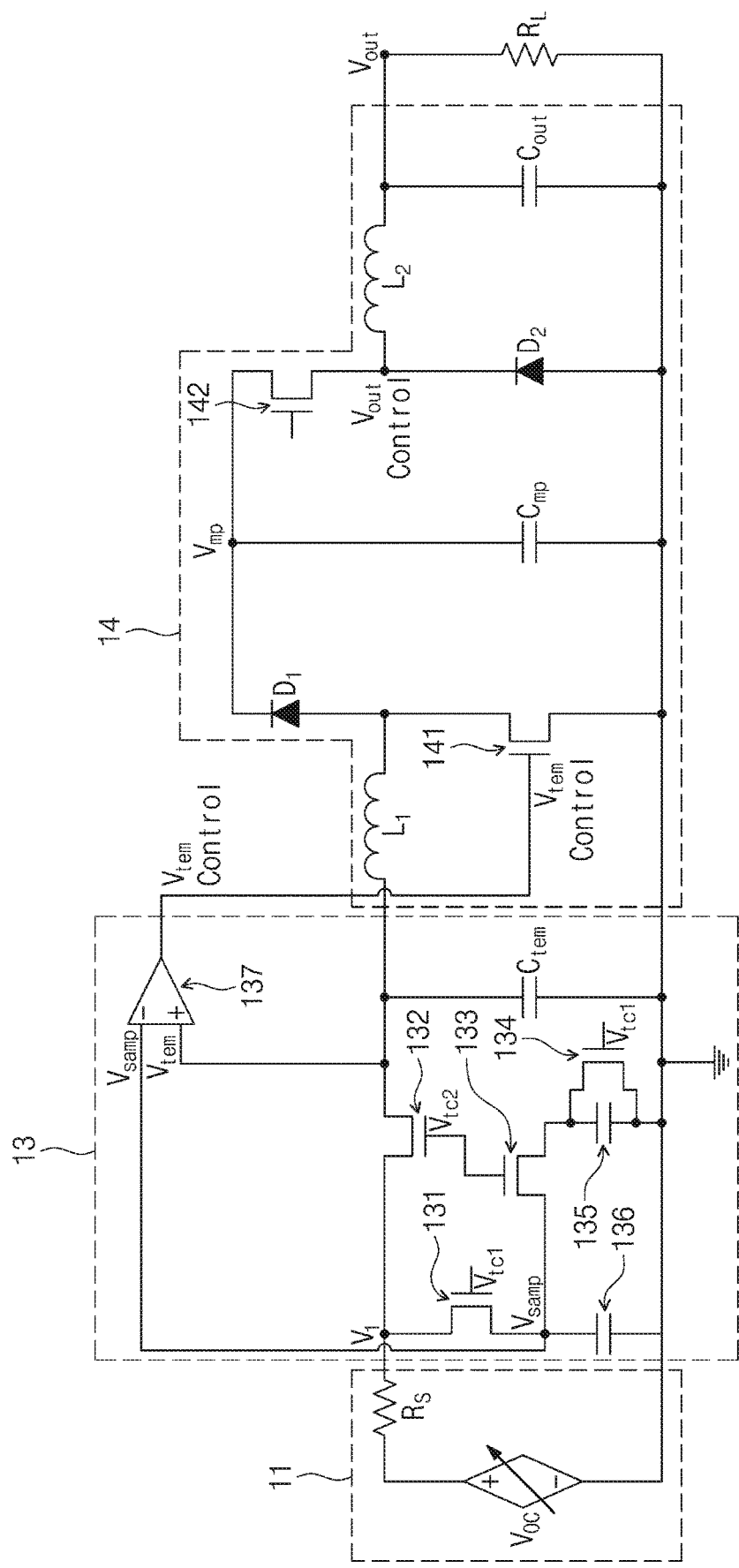
FIG. 2 is a circuit diagram illustrating a system of FIG. 1.

FIG. 2 is a circuit diagram illustrating a system of FIG. 1. Referring to FIG. 2, for convenience of illustration, only the energy harvesting device 11, and the switching circuit 13 and the conversion circuit 14 of the power management integrated circuit 12 are illustrated in the system 10, and the measuring device 100 is omitted from the illustration. Also referring to FIG. 2, a load $R_L$ of the external device is exemplarily illustrated as being connected to the conversion circuit 14.

The energy harvesting device 11 may include an internal voltage source and an internal resistor $R_S$ for outputting an open circuit voltage $V_{OC}$ by harvesting energy from the surrounding environment. The energy harvesting device 11 may transmit an input voltage $V_1$ of the switching circuit 13 to the switching circuit 13. In this case, the open circuit voltage $V_{OC}$ may represent the voltage of the energy harvesting device 11 when the energy harvesting device 11 is in an open circuit state (e.g., when there is no device connected to the energy harvesting device 11 or the input impedance $Z_{IN}$ of the power management integrated circuit 12 is infinite). In contrast, the input voltage $V_1$ that is transmitted to the switching circuit 13 may represent the voltage of the energy harvesting device 11 when the energy harvesting device 11 is not in the open circuit state and is connected to the power management integrated circuit 12. The open circuit voltage $V_{OC}$ and the input voltage $V_1$ may be different from each other due to the internal resistor $R_S$ of the energy harvesting device 11.

The switching circuit 13 may include first to fourth switching transistors 131 to 134, first to third switching capacitors 135, 136, and $C_{tem}$, and a comparator 137. The switching circuit 13 may transmit an adjustment voltage $V_{tem}$ generated by adjusting the input voltage $V_1$ to the conversion circuit 14. For example, the switching circuit 13 may control a level of the adjustment voltage $V_{tem}$ by controlling an operation (e.g., turn on or turn off) of the switching transistors 131 to 134. The switching capacitors 135, 136, and $C_{tem}$ may store capacitive energy. The switching capacitors 135, 136, and $C_{tem}$ may discharge the stored capacitive energy.

The switching circuit 13 may transmit the adjustment voltage $V_{tem}$ that satisfies a maximum power transfer condition to the conversion circuit 14 by controlling the level of the adjustment voltage $V_{tem}$. In one embodiment, the level of the adjustment voltage $V_{tem}$ may be determined by characteristics of the energy harvesting device 11. For example, the switching circuit 13 may be directly connected to the energy harvesting device 11, and the input impedance $Z_{IN}$ of the power management integrated circuit 12 may be determined by the operation of the switching circuit 13.

The conversion circuit 14 may include first and second conversion inductors $L_1$ and $L_2$, first and second conversion transistors 141 and 142, and first and second conversion diodes $D_1$ and $D_2$, and first and second conversion capacitors $C_{mp}$ and $C_{out}$. The conversion circuit 14 may convert the adjustment voltage $V_{tem}$ to an output voltage $V_{out}$ of the conversion circuit 14 by controlling the operation of the conversion transistors 141 and 142. In one embodiment, the conversion circuit 14 may include one of a boost converter, a buck converter, and a buck-boost converter.

The load $R_L$ may consume power transferred from the conversion circuit 14. In one embodiment, the load $R_L$ may include a light-emitting diode (LED). In one embodiment, the load $R_L$ may include household appliances such as a TV, a refrigerator, an air conditioner, etc.

Figure 3:
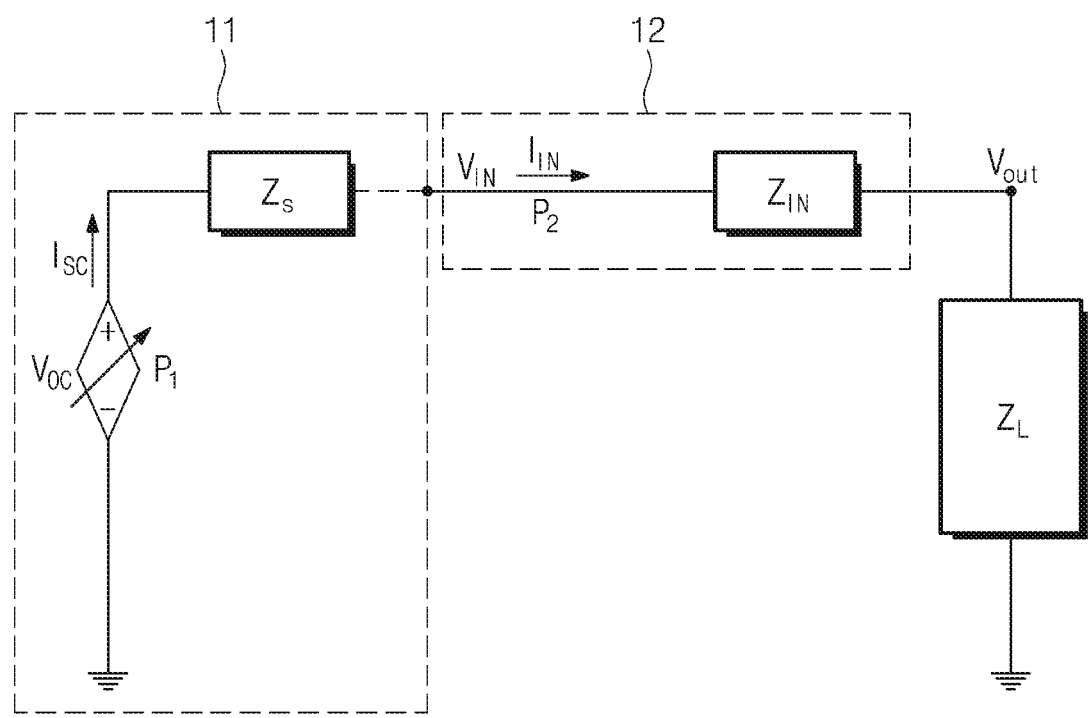
FIG. 3 is a diagram illustrating a circuit diagram of a system of FIG. 2 more briefly.

FIG. 3 is a diagram illustrating a circuit diagram of a system of FIG. 2 more briefly. Referring to FIGS. 1 and 3, the system 10 for tracking the maximum power point may include the energy harvesting device 11, the power management integrated circuit 12, and a load $Z_L$.

The energy harvesting device 11 may include an internal voltage source and the internal impedance $Z_S$ for outputting the open circuit voltage $V_{OC}$ and a short circuit current $I_{SC}$ by harvesting energy from the surrounding environment. The internal voltage source of the energy harvesting device 11 may output power $P_{MPP}$ based on the open circuit voltage $V_{OC}$. For example, the power $P_{MPP}$ may be $½ \times V_{OC} \times I_{SC}$. The short circuit current $I_{SC}$ may represent a current flowing through the energy harvesting device 11 when both ends of the energy harvesting device 11 are shorted.

The power management integrated circuit 12 may include the input impedance $Z_{IN}$. The power management integrated circuit 12 may receive an input voltage $Y_{IN}$ and an input current $I_{IN}$ from the energy harvesting device 11. The power management integrated circuit 12 may receive power $P_2$ based on the internal impedance $Z_S$ and the input voltage $V_{IN}$ from the energy harvesting device 11. The power management integrated circuit 12 may adjust the level of the input voltage $V_{IN}$, based on power required by the load $Z_L$. The power management integrated circuit may transmit the output voltage $V_{OUT}$ to the load $Z_L$.

The load $Z_L$ may receive the output voltage $V_{OUT}$ from the power management integrated circuit 12. The load $Z_L$ may receive the power based on the output voltage $V_{OUT}$ from the power management integrated circuit 12.

Figure 4:
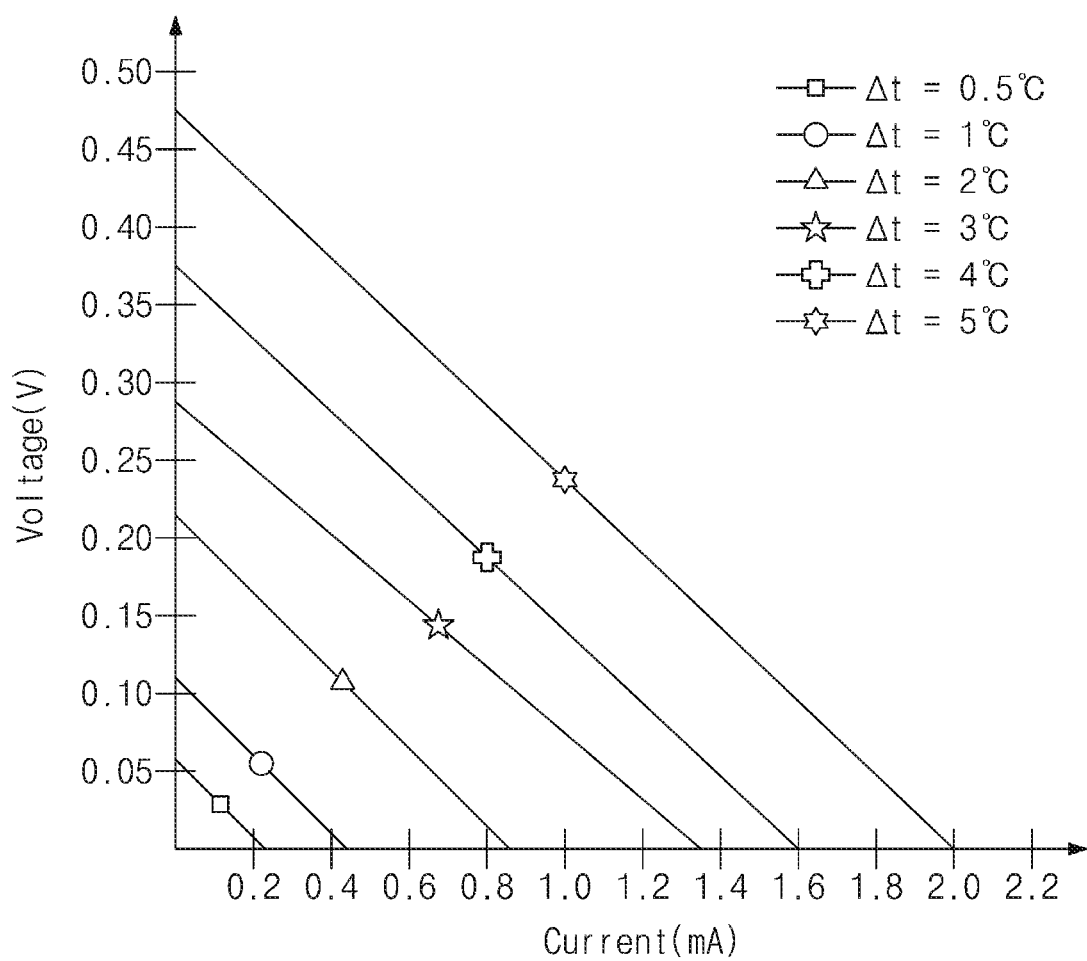
FIG. 4 is a graph illustrating characteristics of a short circuit current-to-an open circuit voltage of a thermoelectric energy harvesting device, based on a temperature of the thermoelectric energy harvesting device.
Figure 5:
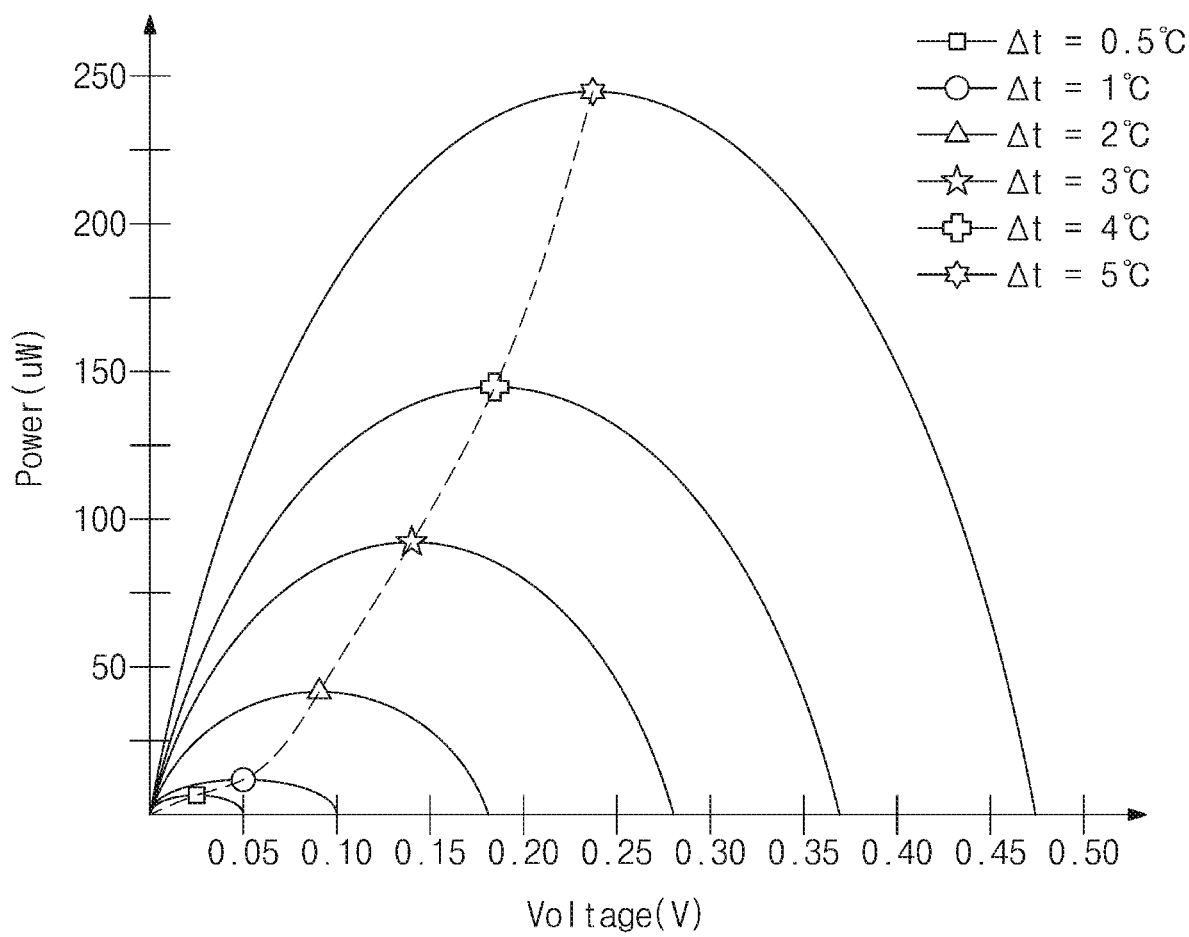
FIG. 5 is a graph illustrating characteristics of an open circuit voltage of a thermoelectric energy harvesting device-to-an output power of the thermoelectric energy harvesting device, based on a temperature of the thermoelectric energy harvesting device.

FIG. 4 is a graph illustrating characteristics of a short circuit current-to-an open circuit voltage of a thermoelectric energy harvesting device, based on a temperature of the thermoelectric energy harvesting device. FIG. 5 is a graph illustrating characteristics of an open circuit voltage of a thermoelectric energy harvesting device-to-an output power of the thermoelectric energy harvesting device, based on a temperature of the thermoelectric energy harvesting device. Referring to FIGS. 1, and 3 to 5, in one embodiment, the energy harvesting device 11 may include a thermoelectric energy harvesting device (thermoelectric generator; TEG). FIGS. 4 and 5 illustrated a graph when the energy harvesting device 11 is the thermoelectric energy harvesting device TEG, but the inventive concept is not limited to the case where the energy harvesting device 11 is the thermoelectric energy harvesting device TEG.

Short circuit current-to-open circuit voltage characteristics and open circuit voltage-to-output power characteristics of the energy harvesting device 11 may be determined based on a type of the energy harvesting device 11. Conditions for supplying a maximum power to the load $Z_L$ may be determined based on the type of the energy harvesting device 11.

Referring to a graph of FIG. 4, the short circuit current $I_{SC}$ of the thermoelectric energy harvesting device TEG may be inversely proportional to the open circuit voltage $V_{OC}$ of the thermoelectric energy harvesting device TEG. The open circuit voltage $V_{OC}$ of the thermoelectric energy harvesting device TEG may increase as a temperature of the thermoelectric energy harvesting device TEG increases.

Referring to Equation 1 to Equation 3 below, when the internal impedance $Z_S$ of the thermoelectric energy harvesting device TEG is the same as the input impedance $Z_{IN}$ of the power management integrated circuit 12, the maximum power may be obtained from the thermoelectric energy harvesting device TEG. That is, the thermoelectric energy harvesting device TEG may output the maximum power when the internal impedance $Z_S$ is matched to the input impedance $Z_{IN}$. A loss may occur between power $P_1$ based on the open circuit voltage $V_{OC}$ of the thermoelectric energy harvesting device TEG and power $P_2$ based on the input voltage $V_{IN}$ of the power management integrated circuit 12 by a difference between the internal impedance $Z_S$ of the thermoelectric energy harvesting device TEG and the input impedance $Z_{IN}$ of the power management integrated circuit 12.

$$P_2 = V_{IN}I_{IN} = \frac{V_{IN}(V_{OC} - V_{IN})}{Z_S}[W] \quad \text{[Equation 1]}$$

In Equation 1, the power $P_2$ may be expressed as a product of the input voltage $V_{IN}$ and the input current $I_{IN}$ of the power management integrated circuit 12. The power $P_2$ may be expressed by a relational equation between the input voltage $V_{IN}$ and the open circuit voltage $V_{OC}$.

$$\left.\frac{\partial P_2}{\partial V_{IN}}\right|_{max} = \frac{V_{OC} - 2V_{IN}}{Z_S}[W] \quad \text{[Equation 2]}$$

$$V_{IN}|_{max} = \frac{V_{OC}}{2}[V] \text{ and } P_{max} = \frac{V_{OC}^2}{4Z_S}[W] \quad \text{[Equation 3]}$$

In Equation 2 and Equation 3, the condition of the input voltage $V_{IN}$ for obtaining the maximum power '$P_{max}$' in the thermoelectric energy harvesting device TEG may be expressed. When a magnitude of the input voltage $V_{IN}$ corresponds to a half of the magnitude of the open circuit voltage $V_{OC}$, the maximum power '$P_{max}$' may be transmitted from the thermoelectric energy harvesting device TEG to the power management integrated circuit 12. Referring to a graph of FIG. 5, when the magnitude of the input voltage $V_{IN}$ corresponds to a half of the magnitude of the open circuit voltage $V_{OC}$, it may be confirmed that the maximum power is transferred by matching between the internal impedance $Z_S$ and the input impedance $Z_{IN}$.

In one embodiment, to accomplish the matching between the internal impedance $Z_S$ and the input impedance $Z_{IN}$, the switching circuit 13 of the power management integrated circuit 12 may control the operation of the switching transistors 131 to 134 to adjust the level of the input voltage $V_{IN}$.

To obtain the maximum power from the energy harvesting device 11, maximum power point tracking (MPPT) technology may be applied. Equation for measuring a maximum power point tracking efficiency is shown in Equation 4 below.

$$\eta_m = \frac{P_2}{P_{MPP}} \quad \text{[Equation 4]}$$

In Equation 4, '$\eta_m$' represents the maximum power point tracking efficiency. '$P_{MPP}$' represents the maximum power that can be obtained from the energy harvesting device 11. The efficiency '$\eta_m$' may be expressed as a ratio of the power $P_2$ based on the input voltage $V_{IN}$ of the power management integrated circuit 12 to the maximum power '$P_{MPP}$'.

In one embodiment, a device that measures the efficiency '$\eta_m$' may measure the maximum power '$P_{MPP}$' that can be obtained from the energy harvesting device 11, may connect the power management integrated circuit 12 and the energy harvesting device 11, and may measure the power $P_2$ based on the input voltage $V_{IN}$ of the power management integrated circuit 12. That is, the device that measures the efficiency '$\eta_m$' may measure the open circuit voltage $V_{OC}$ and the short circuit current $I_{SC}$ of the energy harvesting device 11 and the input voltage $V_{IN}$ and the input current $I_{IN}$ of the power management integrated circuit 12. Accordingly, since the device for measuring the efficiency '$\eta_m$' needs to measure a plurality of voltages and currents, it requires a high cost and a lot of time to measure.

Figure 6:
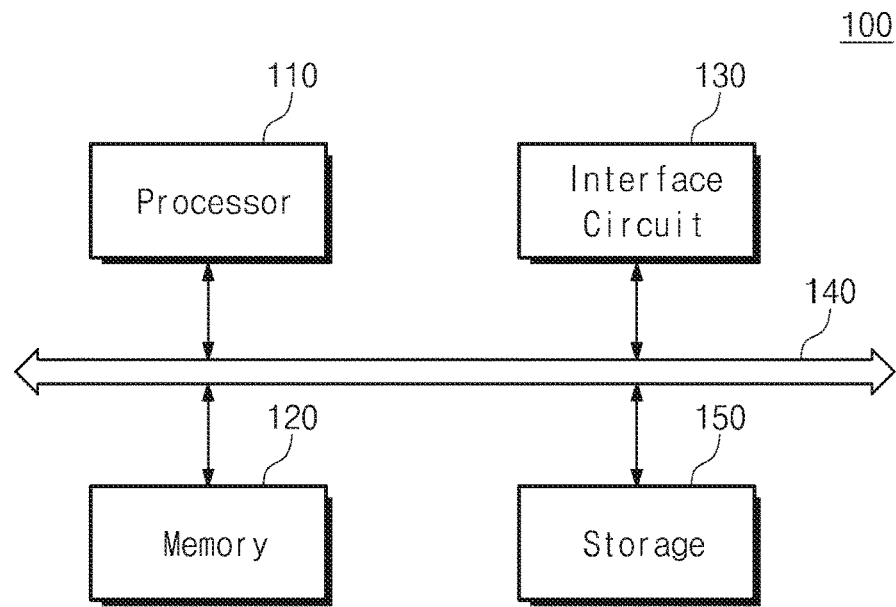
FIG. 6 is a block diagram illustrating a measuring device of FIG. 1 according to an embodiment of the inventive concept.

FIG. 6 is a block diagram illustrating a measuring device of FIG. 1 according to an embodiment of the inventive concept. Referring to FIGS. 1, 3, and 6, the measuring device 100 may include a processor 110, a memory 120, an interface circuit 130, a bus 140, and storage 150.

The processor 110 may perform a function as a central processing unit of the measuring device 100. For example, the processor 110 may execute application, software, firmware, or program code to calculate the efficiency '$\eta_m$' using the internal impedance $Z_S$ of the energy harvesting device 11 received through the interface circuit 130 and the input impedance $Z_{IN}$ of the power management integrated circuit 12. The processor 110 may control the memory 120, the interface circuit 130, and the storage 150. The number of the processor 110 may be one or more. The processor 110 may operate by utilizing storage areas of the memory 120, and may load the above-described application, software, firmware, or program code from the storage 150 into the memory 120. The processor 110 may further execute operating system and various applications loaded in the memory 120, as well as the above-described application, software, firmware, or program code. The detailed operation method of the measuring device 100 controlled by the processor 110 will be described later.

The memory 120 may store data and program codes processed or to be processed by the processor 110. The memory 120 may be used as a main memory of the measuring device 100. The memory 120 may include a Dynamic Random Access Memory (DRAM), a Static Random Access Memory (SRAM), a Phase-change Random Access Memory (PRAM), a Magnetic Random Access Memory (MRAM), a Ferroelectronic Random Access Memory (FeRAM), and a Resistive Random Access Memory (RRAM), and may also be referred to as a buffer memory or a cache memory. The number of the memories 120 may be one or more. The memory 120 may also be implemented as an external device that can communicate with the measuring device 100.

The interface circuit 130 may communicate with the energy harvesting device 11 and the power management integrated circuit 12, based on various wired or wireless protocols under a control of the processor 110. For example, the interface circuit 130 may receive a value of the internal impedance $Z_S$ of the energy harvesting device 11 from the energy harvesting device 11 in response to a request of the processor 110. The interface circuit 130 may receive a value of the input impedance $Z_{IN}$ of the power management integrated circuit 12 from the power management integrated circuit 12 in response to the request of the processor 110. The interface circuit 130 may output the efficiency '$\eta_m$' calculated by the processor 110.

The bus 140 may provide a communication path among components of the measuring device 100. The processor 110, the memory 120, the interface circuit 130, and the storage 150 may exchange data with one another through the bus 140. The bus 140 may be configured to support various types of communication formats used in the measuring device 100.

The storage 150 may store data generated for long-term storage by the operating system or applications, a file for driving the operating system, or executable files of applications. For example, the storage 150 may store files for execution of the memory 120. The storage 150 may be used as an auxiliary memory device of the measuring device 100. The storage 150 may include a flash memory, the PRAM, the MRAM, the FeRAM, the RRAM, etc.

Figure 7:
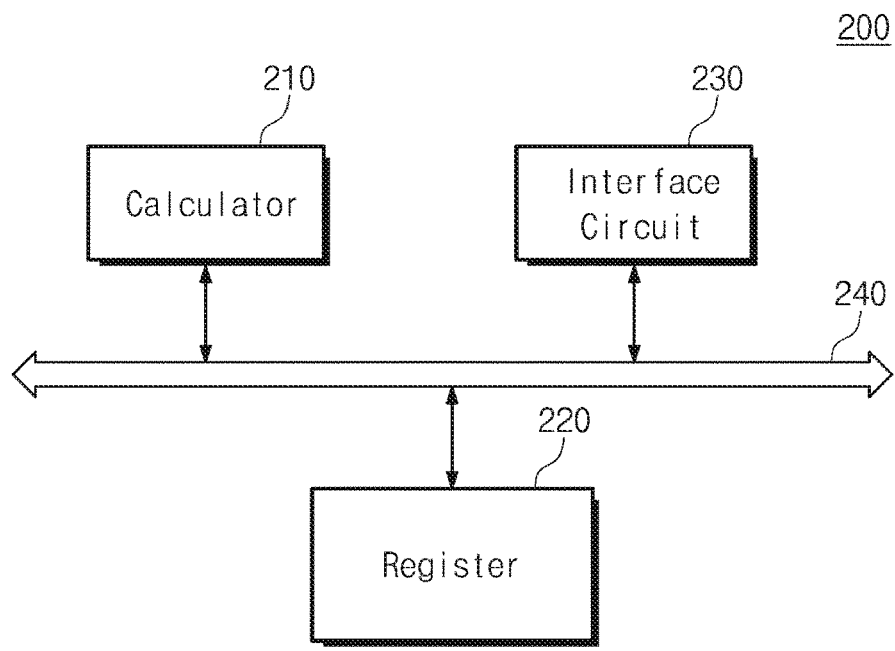
FIG. 7 is a block diagram illustrating a measuring device of FIG. 1 according to another embodiment of the inventive concept.

FIG. 7 is a block diagram illustrating a measuring device of FIG. 1 according to another embodiment of the inventive concept. Referring to FIGS. 1, 3, and 7, a measuring device 200 according to another embodiment of the inventive concept may include a calculator 210, a register 220, an interface circuit 230, and a bus 240. The measuring device 200 may be an example of the measuring device 100 of FIG. 1.

The calculator 210 may perform a function as a central processing unit of the measuring device 200. For example, the calculator 210 may calculate the efficiency '$\eta_m$' using the internal impedance $Z_S$ of the energy harvesting device 11 received by the interface circuit 230 and the input impedance $Z_{IN}$ of the power management integrated circuit 12. The detailed operation of the calculator 210 will be described later.

The register 220 may store values calculated by the calculator 210 and values received by the interface circuit 230. For example, the register 220 may store the efficiency '$\eta_m$' calculated by the calculator 210. The register 220 may store the internal impedance $Z_S$ and the input impedance $Z_{IN}$ received by the interface circuit 230.

The measuring device 200 may receive and transmit information from the energy harvesting device 11 and the power management integrated circuit 12 through the interface circuit 230. The interface circuit 230 may communicate with the energy harvesting device 11 and the power management integrated circuit 12, based on various wired or wireless protocols. For example, the interface circuit 230 may receive information on the value of the internal impedance $Z_S$ from the energy harvesting device 11. The interface circuit 230 may receive information on the value of the input impedance $Z_{IN}$ from the power management integrated circuit 12. The interface circuit 230 may output information associated with the efficiency '$\eta_m$' calculated by the calculator 210.

The bus 240 may provide a communication path among components of the measuring device 200. The calculator 210, the register 220, and the interface circuit 230 may exchange data with one another through the bus 240. The bus 240 may be configured to support various types of communication formats used in the measuring device 200.

Figure 8:
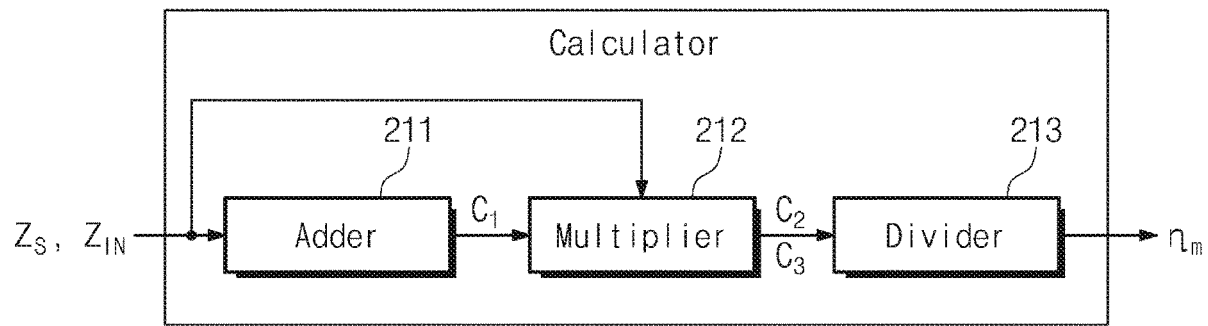
FIG. 8 is a block diagram specifically describing an operation of a calculator of FIG. 7.

FIG. 8 is a block diagram specifically describing an operation of a calculator of FIG. 7. Referring to FIGS. 1, 3, and 6 to 8, the calculator 210 of the measuring device 200 may include an adder 211, a multiplier 212, and a divider 213.

Referring to Equations 5 to 7 below, the efficiency '$\eta_m$' is expressed as the internal impedance $Z_S$ of the energy harvesting device 11 and the input impedance $Z_{IN}$ of the power management integrated circuit 12.

$$\eta_m = \frac{P_2}{P_{MPP}} = \frac{V_{IN} * I_{IN}}{\frac{1}{2} V_{OC} * I_{SC}} \qquad \text{[Equation 5]}$$

The efficiency '$\eta_m$' expressed associated with the power '$P_2$' and the maximum power '$P_{MPP}$' in Equation 4 may be expressed in relation to the input voltage $V_{IN}$, the input current $I_{IN}$, the open circuit voltage $V_{OC}$, and the short circuit current $I_{SC}$ in Equation 5.

$$\eta_m = \frac{P_2}{P_{MPP}} = \frac{\frac{Z_{IN}}{Z_S + Z_{IN}} * V_{OC} * \frac{V_{OC}}{Z_S + Z_{IN}}}{\frac{1}{4} \frac{V_{OC}^2}{Z_S}} \qquad \text{[Equation 6]}$$

The efficiency '$\eta_m$' expressed in relation to the input voltage $V_{IN}$, the input current $I_{IN}$, the open circuit voltage $V_{OC}$, and the short circuit current $I_{SC}$ in Equation 5 may be expressed associated with the input voltage $V_{IN}$, the open circuit voltage $V_{OC}$, the internal impedance $Z_S$, and the input impedance $Z_{IN}$. Equation 7 summarizes Equation 6.

$$\eta_m = \frac{P_2}{P_{MPP}} = \frac{4 Z_S * Z_{IN}}{(Z_S + Z_{IN})^2} \qquad \text{[Equation 7]}$$

Through Equation 7, the efficiency '$\eta_m$' may be expressed associated with the internal impedance $Z_S$ and the input impedance $Z_{IN}$. In one embodiment, the calculator 210 of the measuring device 200 may calculate the efficiency '$\eta_m$' based on Equation 7. In one embodiment, the calculator 210 may calculate the efficiency '$\eta_m$' using only the internal impedance $Z_S$ and the input impedance $Z_{IN}$.

For example, the adder 211 of the calculator 210 may receive the internal impedance $Z_S$ and the input impedance $Z_{IN}$ from the interface circuit 230 through the bus 240. The adder 211 may calculate a first value $C_1$ that is a sum of the internal impedance $Z_S$ and the input impedance $Z_{IN}$. The adder 211 may transmit the first value $C_1$ to the multiplier 212.

The multiplier 212 of the calculator 210 may receive information associated with the value of the internal impedance $Z_S$ and information associated with the value of the input impedance $Z_{IN}$ from the interface circuit 230 through the bus 240. The multiplier 212 may calculate a product of the internal impedance $Z_S$ and the input impedance $Z_{IN}$. The multiplier 212 may calculate a second value $C_2$ that is k (k is an integer of 1 or more) times of the calculated product.

The multiplier 212 may receive the first value $C_1$ from the adder 211. The multiplier 212 may calculate a third value $C_3$ that is 'm'-th ('m' is an integer of 2 or more) power (or 'm' square) of the first value $C_1$. The multiplier 212 may transmit the second value $C_2$ and the third value $C_3$ to the divider 213.

The divider 213 may receive the second value $C_2$ and the third value $C_3$ from the multiplier 212. The divider 213 may calculate the ratio of the second value $C_2$ and the third value $C_3$. For example, the divider 213 may calculate the efficiency '$\eta_m$' by calculating the ratio of the second value $C_2$ to the third value $C_3$.

For example, 'k' may be 4, and 'm' may be 2. For another example, 'k' may be 400 and 'm' may be 2. However, the scope of the inventive concept is not limited to the above-described values. The unit of efficiency '$\eta_m$' may be [%].

Figure 9:
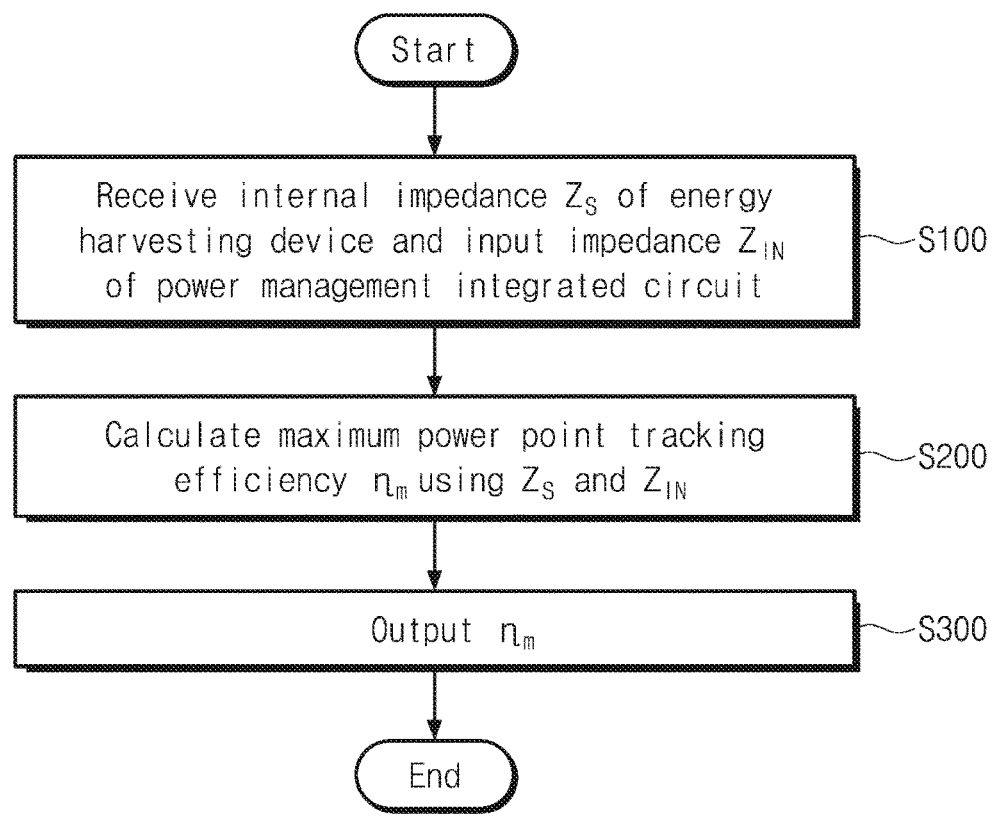
FIG. 9 is a flowchart describing an operating method of a measuring device of FIG. 1 according to an embodiment of the inventive concept.

FIG. 9 is a flowchart describing an operating method of a measuring device of FIG. 1 according to an embodiment of the inventive concept. Referring to FIGS. 1, 3, 6, and 9, the measuring device 100 may perform operations S100 to S300 under the control of the processor 110.

In operation S100, the interface circuit 130 of the measuring device 100 may receive the internal impedance $Z_S$ of the energy harvesting device 11 under the control of the processor 110 from the energy harvesting device 11. The interface circuit 130 may receive the input impedance $Z_{IN}$ of the power management integrated circuit 12 from the power management integrated circuit 12 under the control of the processor 110. The interface circuit 130 may transmit the internal impedance $Z_S$ and the input impedance $Z_{IN}$ to the processor 110 and the memory 120 through the bus 140.

In operation S200, the measuring device 100 may calculate the maximum power point tracking efficiency '$\eta_m$' using the internal impedance $Z_S$ and the input impedance $Z_{IN}$ under the control of the processor 110. The maximum power point tracking efficiency '$\eta_m$' may be the efficiency '$\eta_m$' of Equations 4 to 7 described above. The processor 110 of the measuring device 100 may transmit the maximum power point tracking efficiency '$\eta_m$' to the memory 120 and the interface circuit 130 through the bus 140. Operation S200 will be described later in detail.

In operation S300, the interface circuit 130 of the measuring device 100 may output the maximum power point tracking efficiency '$\eta_m$' under the control of the processor 110. For example, the interface circuit 130 may output the maximum power point tracking efficiency '$\eta_m$' to the power management integrated circuit 12 or a user terminal. In this case, the switching circuit 13 of the power management integrated circuit 12 may control the operation of the switching transistors 131 to 134, based on the maximum power point tracking efficiency '$\eta_m$'.

Figure 10:
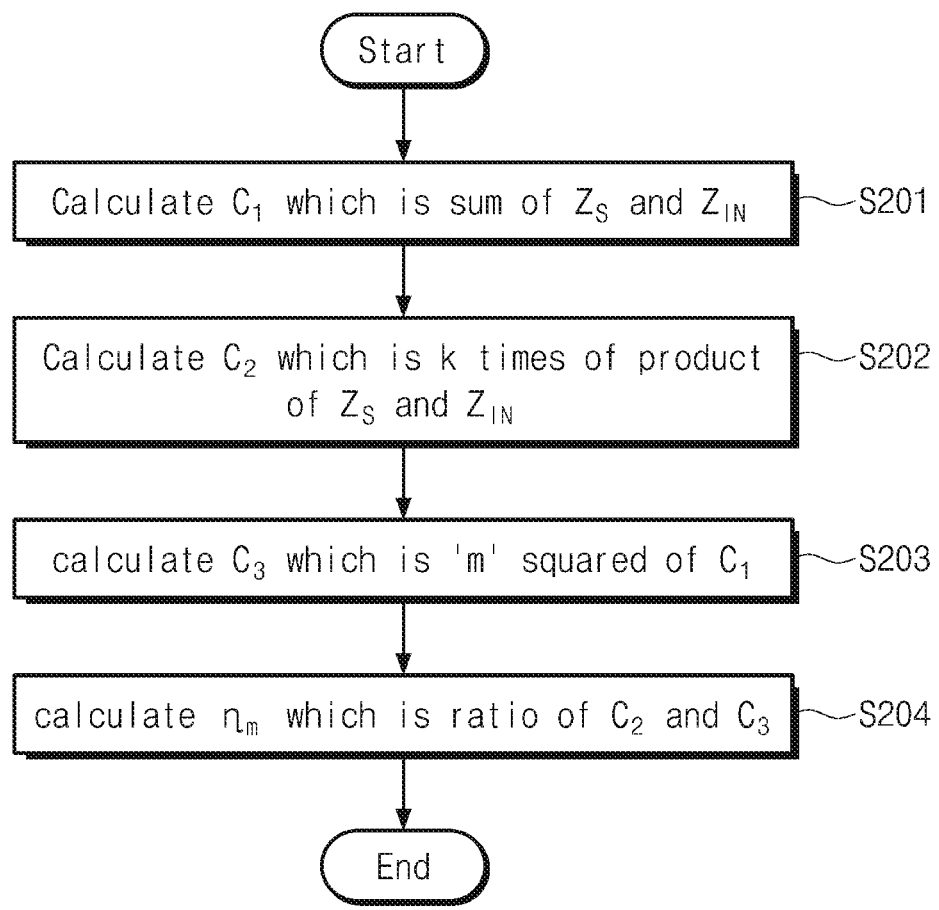
FIG. 10 is a flowchart specifically describing operation S200 of FIG. 9.

FIG. 10 is a flowchart specifically describing operation S200 of FIG. 9. Referring to FIGS. 1, 3, 6, 9, and 10, the measuring device 100 may perform operations S201 to S204 under the control of the processor 110.

In operation S201, the measuring device 100 may calculate the first value $C_1$ that is the sum of the internal impedance $Z_S$ and the input impedance $Z_{IN}$. In operation S202, the measuring device 100 may calculate the product of the internal impedance $Z_S$ and the input impedance $Z_{IN}$. The measuring device 100 may calculate the second value $C_2$ that is k times of the calculated product. In operation S203, the measuring device 100 may calculate the third value $C_3$ that is 'm' square (or 'm'-th power) of the first value $C_1$. In operation S204, the measuring device 100 may calculate the ratio of the second value $C_2$ and the third value $C_3$. For example, the measuring device 100 may calculate the maximum power point tracking efficiency '$\eta_m$' by calculating the ratio of the second value $C_2$ to the third value $C_3$.

In one embodiment, the measuring device 100 may calculate the maximum power point tracking efficiency '$\eta_m$', based on Equation 7 described above. In one embodiment, the measuring device 100 may calculate the maximum power point tracking efficiency '$\eta_m$' using only the internal impedance $Z_S$ and the input impedance $Z_{IN}$.

According to an embodiment of the inventive concept, a measuring device for tracking a maximum power point may economically calculate an efficiency of the maximum power point tracking technology in a short time, by using an internal impedance of an energy harvesting device and an input impedance of a power management integrated circuit.

The contents described above are specific embodiments for implementing the inventive concept. The inventive concept will include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A system for tracking a maximum power point comprising:
   an energy harvesting device;
   a power management integrated circuit including a switching circuit configured to adjust an input voltage that is transmitted from the energy harvesting device and a conversion circuit configured to convert the input voltage adjusted by the switching circuit to output an output voltage; and
   a measuring device configured to calculate a ratio of a second power based on the input voltage to a first power based on an open circuit voltage of the energy harvesting device, using an internal impedance of the energy harvesting device and an input impedance of the power management integrated circuit.

2. The system of claim 1, wherein the second power is determined based on the internal impedance of the energy harvesting device and the input voltage.

3. The system of claim 1, wherein the energy harvesting device includes one of a thermoelectric energy harvesting device, a piezoelectric energy harvesting device, a radio frequency (RF) energy harvesting device, and a photoelectric energy harvesting device.

4. The system of claim 1, wherein the switching circuit is further configured to:
adjust the input voltage such that a magnitude of the input voltage is half of a magnitude of the open circuit voltage of the energy harvesting device, and
transmit the adjusted input voltage to the conversion circuit.

5. The system of claim 1, wherein the measuring device is further configured to transmit the ratio of the second power to the first power to the switching circuit, and
wherein the switching circuit is further configured to adjust the input voltage based on the ratio.

6. The system of claim 1, wherein the conversion circuit includes one of a boost converter, a buck converter, and a buck-boost converter.

7. The system of claim 1, wherein the measuring device is further configured to calculate the ratio of the second power to the first power using only the internal impedance of the energy harvesting device and the input impedance of the power management integrated circuit.

8. The system of claim 1, wherein the measuring device includes:
an adder configured to calculate a first value which is a sum of the internal impedance of the energy harvesting device and the input impedance of the power management integrated circuit;
a multiplier configured to:
calculate a second value which is 'k' (where 'k' is an integer of 1 or more) times of a product of the internal impedance of the energy harvesting device and the input impedance of the power management integrated circuit, and:
calculate a third value which is a 'm'-th (where 'm' is an integer of 2 or more) power of a sum of the internal impedance of the energy harvesting device and the input impedances of the power management integrated circuit; and
a divider configured to calculate the ratio of the second value to the third value.

9. The system of claim 8, wherein the 'k' is 4, and wherein the 'm' is 2.

10. The system of claim 1, wherein the system further includes an external device electrically connected to the power management integrated circuit and configured to receive the output voltage from the power management integrated circuit.

11. The system of claim 10, wherein the external device includes one of a battery configured to be charged based on the output voltage and a load configured to consume a power based on the output voltage.

12. A method of operating a measuring device comprising a processor and an interface circuit, the method comprising:
receiving, by the interface circuit, an internal impedance of an energy harvesting device connected to a power management integrated circuit and an input impedance of the power management integrated circuit;
calculating, by the processor, a ratio of a second power based on the input voltage to a first power based on an open circuit voltage of the energy harvesting device, using the internal impedance of the energy harvesting device and the input impedance of the power management integrated circuit; and
outputting the ratio by the interface circuit.

13. The method of claim 12, wherein the second power is determined based on the internal impedance of the energy harvesting device and the input voltage.

14. The method of claim 12, wherein the calculating of the ratio includes:
calculating a first value which is a sum of the internal impedance of the energy harvesting device and the input impedance of the power management integrated circuit;
calculating a second value which is a product of the internal impedance of the energy harvesting device and the input impedance of the power management integrated circuit;
calculating a third value which is a power of the sum of the internal impedance of the energy harvesting device and the input impedance of the power management integrated circuit;
calculating a fourth value which is four times of the second value; and
calculating the ratio of the fourth value to the third value.

15. The method of claim 12, wherein the calculating of the ratio includes calculating the ratio using only the internal impedance of the energy harvesting device and the input impedance of the power management integrated circuit.

* * * * *